United States Patent [19]
Chan

[11] Patent Number: 5,940,709
[45] Date of Patent: Aug. 17, 1999

[54] METHOD AND SYSTEM FOR SOURCE ONLY REOXIDATION AFTER JUNCTION IMPLANT FOR FLASH MEMORY DEVICES

[75] Inventor: Vei-Han Chan, San Jose, Calif.

[73] Assignee: Advanced Micro Devices, Inc., Sunnyvale, Calif.

[21] Appl. No.: 08/993,599

[22] Filed: Dec. 18, 1997

[51] Int. Cl.⁶ .................... H01L 21/8247; H01L 21/266
[52] U.S. Cl. ............................ 438/286; 438/529
[58] Field of Search .................. 438/529, 199, 438/286, 262, 263; 257/387, 388

[56] References Cited

U.S. PATENT DOCUMENTS

| | | | |
|---|---|---|---|
| 4,412,378 | 11/1983 | Shinada | 438/529 |
| 5,510,284 | 4/1996 | Yamauchi | 438/286 |
| 5,756,381 | 5/1998 | Buynoski | 438/199 |
| 5,770,491 | 6/1998 | Mametani | 438/199 |
| 5,776,811 | 7/1998 | Wang et al. | 438/529 |

*Primary Examiner*—Olik Chaudhuri
*Assistant Examiner*—Daniel H. Mao
*Attorney, Agent, or Firm*—Sawyer & Associates

[57] ABSTRACT

A system and method for providing a memory in a semiconductor is disclosed. In one aspect, the method and system include providing a source implant in the semiconductor, providing a first anneal of the source implant in an oxidizing agent, and providing a drain implant in the semiconductor after the first anneal. In another aspect, the method and system include providing a source implant and a drain implant in the semiconductor, providing a mask, and providing an anneal of the source implant, the drain implant, and the mask in an oxidizing agent. The mask exposes the source implant while limiting exposure of at least a portion of the drain implant.

3 Claims, 4 Drawing Sheets

METHOD AND SYSTEM FOR SOURCE ONLY REOXIDATION AFTER JUNCTION IMPLANT FOR FLASH MEMORY DEVICES

FIELD OF THE INVENTION

The present invention relates to flash memory and more particularly to a method and system for reoxidizing the source while limiting reoxidation of the drain, thereby improving drain-side performance.

BACKGROUND OF THE INVENTION

Conventional flash memory cells are formed on a semiconductor. The conventional flash memory cell includes a gate stack, a source, a drain, and a channel between the source and the drain. The gate stack includes a floating gate that is typically separated from the source by a tunnel oxide layer.

During an erase of the conventional memory cell, charged carriers tunnel between the floating gate and the source. In order to improve erase characteristics the appropriate combination of a small tunnel oxide thickness and a large source dopant concentration is desired. In order to provide this combination, a portion of the floating gate overlaps a portion of the source. Typically, this overlap is as large as possible.

In order to form a conventional memory cell, a tunnel oxide is typically grown on a semiconductor. The gate stack is then formed. Self-aligned source and drain implants in the semiconductor are then provided. Because self-aligned source and drain implants are provided, the number of masks used in forming the conventional memory cell is reduced and alignment is improved. An anneal in an oxidizing agent is then performed to improve erase characteristics. During this anneal, a surface of both the source and drain is exposed to the oxidizing agent. This anneal in the oxidizing agent is known as reoxidation.

One of the results of the reoxidation is oxidation enhanced diffusion. Providing the reoxidation increases the diffusion of dopants both laterally and into the semiconductor in areas exposed to the oxidizing agent. Thus, an anneal for a particular time and temperature in an oxidizing agent allows a dopant to diffuse farther than a second anneal for the same time and temperature performed without the oxidizing agent. This characteristic of reoxidation is known as oxidation enhanced diffusion. The oxidation enhanced diffusion improves erase characteristics in part by driving the source farther under the floating gate. This increases the concentration of dopant farther under the floating gate where the tunneling oxide is thinner, increasing tunneling during erase and improving erase characteristics.

Although erase characteristics are improved by the reoxidation, the oxidation enhanced diffusion also brings the source and drain closer together. Tunneling between the floating gate and the drain is typically not used in operation of the conventional memory cell. Consequently, the drain implant typically is not desired to be driven as far under the floating gate as the source. Both the source and drain implant undergo oxidation enhanced diffusion. Thus, both the source and drain implant are driven farther under the floating gate. The channel is, therefore, shortened. This increases undesirable short channel effects, such as leakage of charge carriers between the source and drain. Thus, performance of the conventional memory cell is adversely affected. In addition, conventional memory cells must be made large enough to account for short channel effects.

Accordingly, what is needed is a system and method for providing a memory cell having good erase characteristics while reducing short channel effects. The present invention addresses such a need.

SUMMARY OF THE INVENTION

The present invention provides a system and method for providing a memory. In one aspect, the method and system comprise providing a source implant in the semiconductor, providing a first anneal of the source implant in an oxidizing agent, and providing a drain implant in the semiconductor after the first anneal. In another aspect, the method and system comprise providing a source implant and a drain implant in the semiconductor, providing a mask, and providing an anneal of the source implant, the drain implant, and the mask in an oxidizing agent. The mask exposes the source implant to the oxidizing agent while limiting exposure of at least a portion of the drain implant.

According to the system and method disclosed herein, the present invention provides good erase characteristics while allowing for reduced short channel effects, thereby increasing overall system performance.

BRIEF DESCRIPTION THE DRAWINGS

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
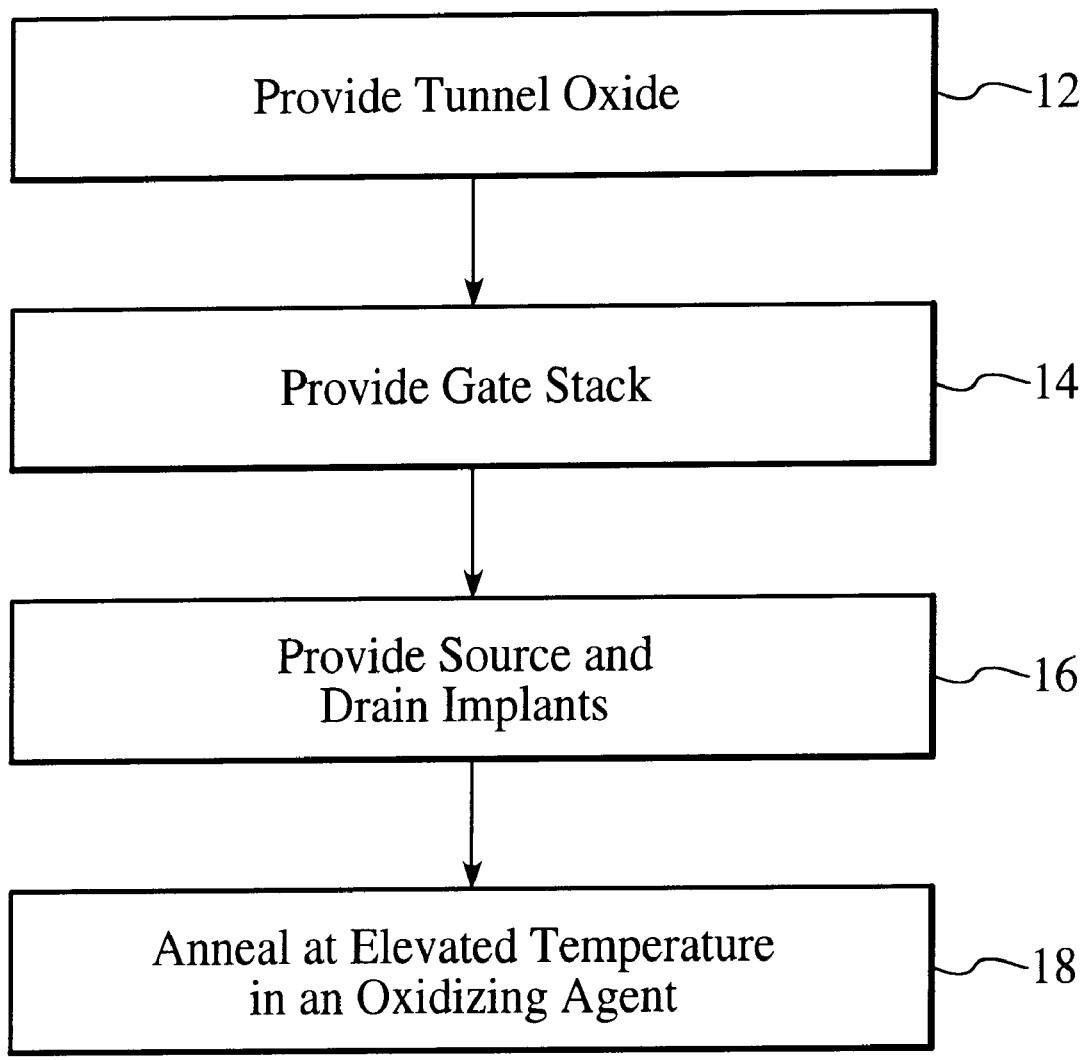
FIG. 1 is a flow chart of a conventional method for providing a flash memory cell.

FIG. 1 is a flow chart of a conventional method 10 for providing a flash memory cell on a semiconductor. A tunnel oxide is grown on a semiconductor via step 12. The gate stack is then formed on the tunnel oxide via step 14. Self-aligned source and drain implants into the semiconductor are then provided via step 16, using the gate stack for alignment. Because self-aligned source and drain implants are provided, the number of masks used in forming the conventional memory cell is reduced and alignment of the source, drain, and gate stack is improved. An anneal of the source and drain implants in an oxidizing agent is then carried out via step 18 to improve erase characteristics. The step 18 of annealing in the oxidizing agent is known as reoxidation.

When annealing dopants, such as the dopants provided in the source and drain implants of step 16, the dopants couple to defects in an underlying semiconductor to diffuse through the semiconductor. Providing the reoxidation step 18 allows an oxide to grow on the surface of the semiconductor 21. Growth of the oxide increases the concentration of defects to which the dopant can couple for diffusion. Therefore, the diffusion of dopants near areas exposed to the oxidizing agent is increased.

Figure 2A:
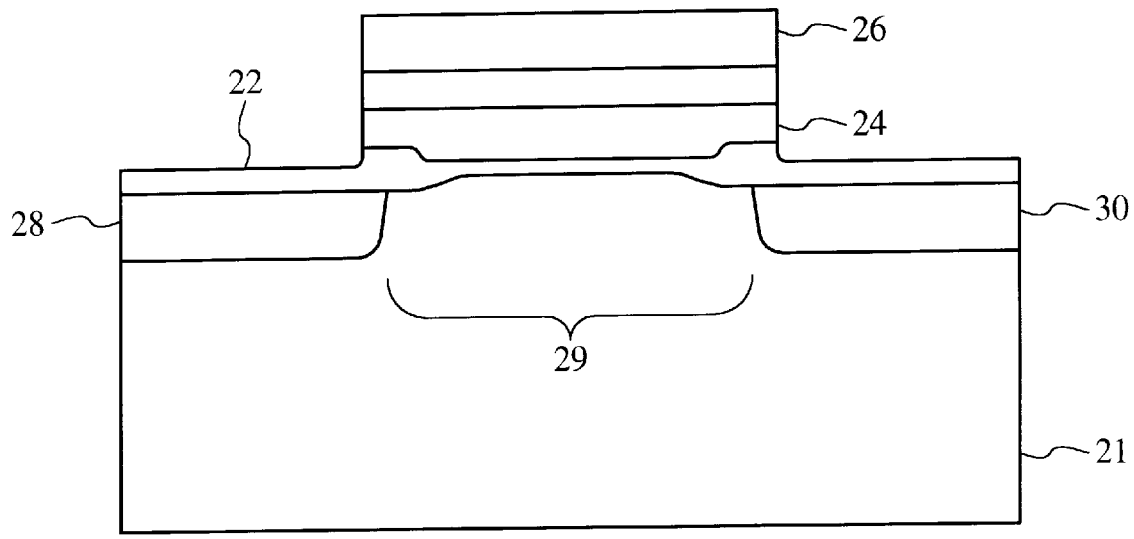
FIG. 2A is a schematic depicting a conventional flash memory cell prior to anneal in an oxidizing agent.

FIG. 2A depicts a conventional flash memory cell 20 formed on a semiconductor 21 prior to the reoxidation step 18. The conventional memory cell 20 includes a tunnel oxide 22, a gate stack having at least a floating gate 24 and a control gate 26, a source 28, and a drain 30. A channel 29 is disposed between the source 28 and the drain 30. The floating gate 24 and the control gate 26 are typically separated by an insulating layer. Because the source 28 and drain 30 are implanted using the floating gate 22 and control gate 24 for alignment, the source 28 and drain 30 do not extend far under the floating gate 24.

Figure 2B:
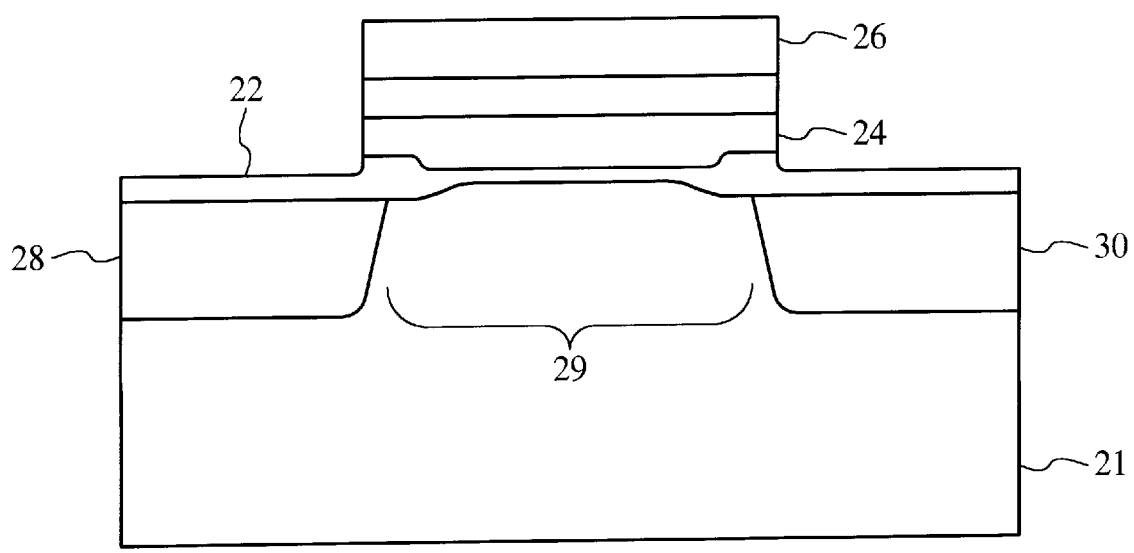
FIG. 2B is a schematic depicting a conventional flash memory cell after the anneal in an oxidizing agent.

FIG. 2B depicts the conventional memory cell 20 after the reoxidation step 18 has been performed to enhance erase characteristics. One of the results of the reoxidation step 18 is oxidation enhanced diffusion of the source 28 and the drain 30. As a result, the source 28 and the drain 30 have been diffused relatively far laterally, under the floating gate 22. The source 28 and drain 30 have been driven farther under the floating gate 22 than if the annealing step 18 had been carried out in the absence of an oxidizing agent. Note that the source 28 and drain 30 have also diffused farther into the semiconductor 21.

The diffusion of the source 28 farther under the floating gate 22 improves erase characteristics of the memory cell 20. The conventional memory cell 20 is erased by tunneling of charge carriers between the floating gate 24 and the source 28. Tunneling during erase increases with decreases in the thickness of the tunnel oxide. Tunneling during erase also increases with increases in the concentration of the source dopant. Driving the source 28 farther under the floating gate 24 increases the concentration of source dopant at locations where the tunnel oxide 22 is smaller. Tunneling is thereby increased. Because the erase is carried out by tunneling of charge carriers between the floating gate 24 and the source 28, an increase in tunneling improves erase characteristics. Thus, erase characteristics are improved by the greater overlap of the source 28 and the floating gate 24.

The oxidation enhanced diffusion providing through the reoxidation step 18 allows the source 28 to be driven farther under the floating gate 24, increasing the concentration of dopant farther under the floating gate 24, where the tunneling oxide 22 is thinner. Thus, erase characteristics of the memory cell 20 are improved partially through the oxidation enhanced diffusion of the source 28.

Although erase characteristics are improved by the reoxidation step 18, one of ordinary skill in the art will also realize that the oxidation enhanced diffusion also drives the drain 30 farther under the floating gate 24. Both the source 28 and the drain 30 are subject to reoxidation step 18. Thus, both the source 28 and the drain 30 are driven farther under the floating gate 24. The channel 29 is, therefore, shortened. This increases undesirable short channel effects, such as leakage of charge carriers between the source and drain.

One of ordinary skill in the art will also realize that tunneling between the floating gate 24 and the drain 30 is typically not used in operation of the memory cell 20. Consequently, the drain 30 typically may not be desired to be as far under the floating gate 24 as the source. Thus, the annealing in an oxidizing agent step 18 drives the drain 30 farther under the floating gate 24 than desired, shortening the channel 29. Thus, the memory cell 20 may be made large enough to sufficiently reduce short channel effects.

The present invention provides for a method and system for providing a flash memory having good erase characteristics while allowing for reduced short channel effects. In one aspect, the method and system comprise providing a source implant in a semiconductor, providing a first anneal of the source implant in an oxidizing agent, and providing a drain implant after the anneal in the oxidizing agent. In another aspect, the method and system comprise providing a source implant and a drain implant in a semiconductor, providing a mask, and providing an anneal of the source implant, the drain implant, and the mask in an oxidizing agent. The mask exposes the source implant to the oxidizing agent wile limiting exposure of the drain implant to the oxidizing agent.

The present invention will be described in terms of methods for providing a flash memory cell having particular steps and using certain materials. However, one of ordinary skill in the art will readily recognize that this method and system will operate effectively for other steps and other materials. In addition, for the sake of clarity, only certain portions of processing methods and memory cells are described.

Figure 3:
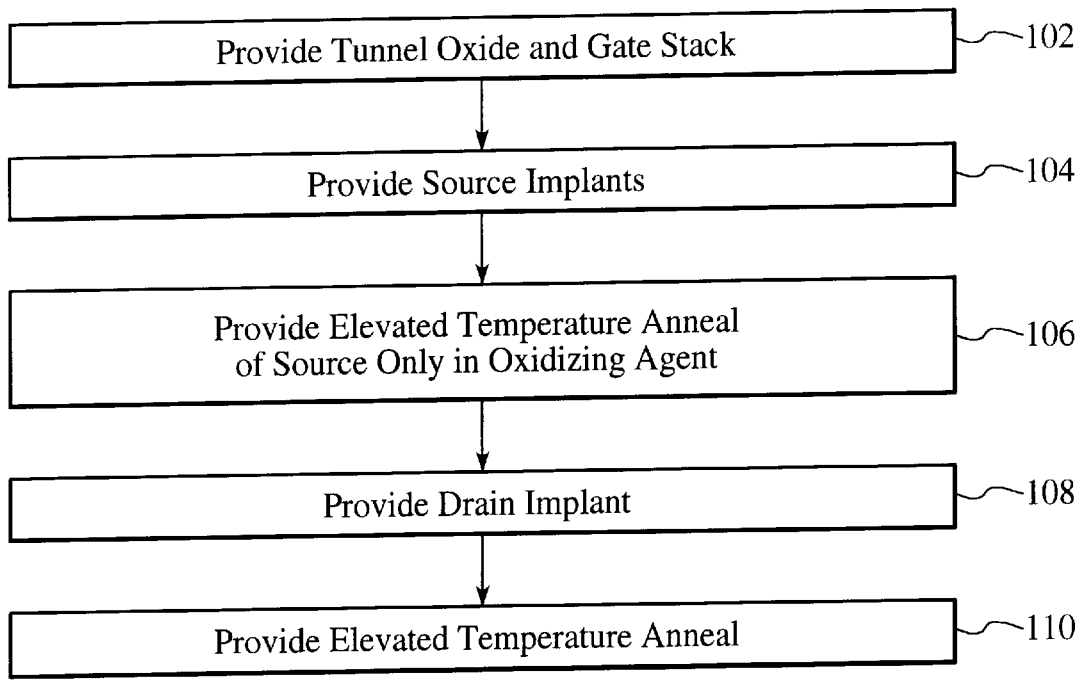
FIG. 3 is a flow chart of one method for providing a flash memory cell in accordance with the present invention.

To more particularly illustrate the method and system in accordance with the present invention, refer now to FIG. 3 depicting a flow chart of one method 100 for providing a flash memory cell in a semiconductor in accordance with the present invention. A tunnel oxide and gate stack are provided on the semiconductor via step 102. In a preferred embodiment, the tunnel oxide and gate stack providing step 102 includes providing at least a floating gate and a control gate. The source implant into the semiconductor is then provided via step 104. The source is then annealed in an oxidizing agent to perform a reoxidation of the source via step 106. Thus, the source undergoes oxidation enhanced diffusion.

After the reoxidation of the source in step 106, a drain implant is provided via step 108. A second anneal may be performed via step 110 which anneals the drain implant and further anneals the source implant. However, the second anneal does not expose the drain to as much of the oxidizing agent as the source implant is exposed to in the first anneal.

Figure 4:
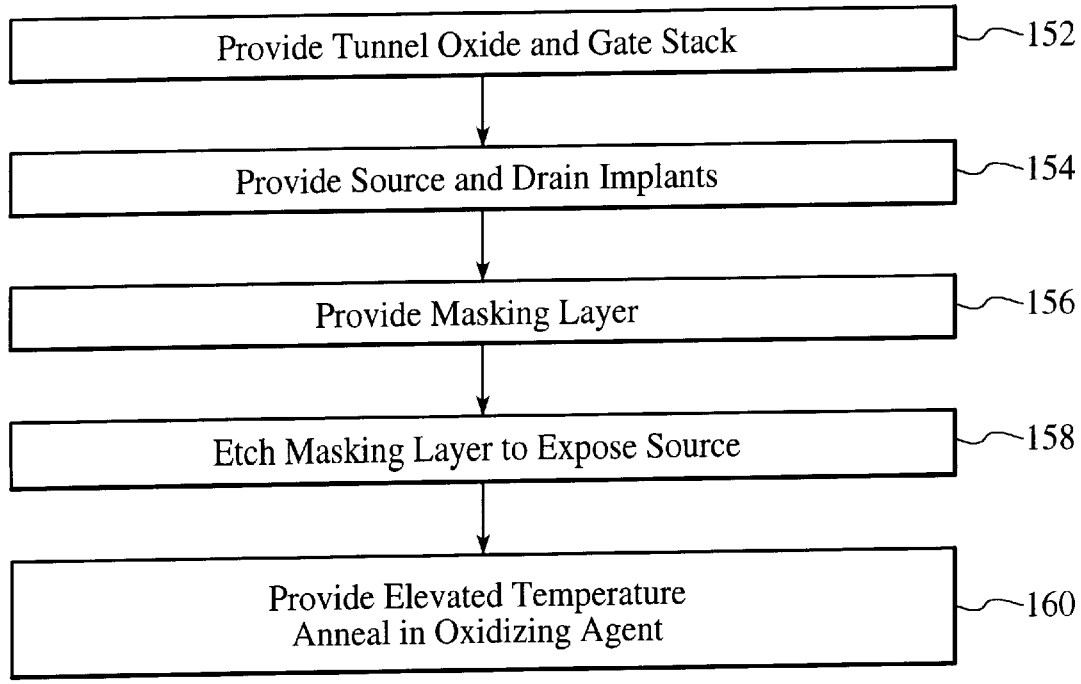
FIG. 4 is a flow chart of another method for providing a flash memory cell in accordance with the present invention.

FIG. 4 depicts a flow chart of another method 150 in accordance with the present invention. A tunnel oxide and gate stack are provided on a semiconductor via step 152. In a preferred embodiment, the tunnel oxide and gate stack providing step 152 includes providing at least a floating gate and a control gate. The source and drain implants into the semiconductor are provided via step 106. Note that the source and drain implants could be decoupled (provided separately) and need not be self-aligned implants.

The drain is then masked via steps 156 and 158. A masking layer is provided via step 156. In a preferred embodiment, the masking layer is a nitride layer. However, nothing prevents the use of another material which prevents an oxidizing agent from reaching the drain. The masking layer is then etched to expose the source in step 158. In a preferred embodiment, the drain is completely covered by the mask. However, a mask which exposes a portion of the drain relatively far from the floating gate may be used.

Figure 5A:
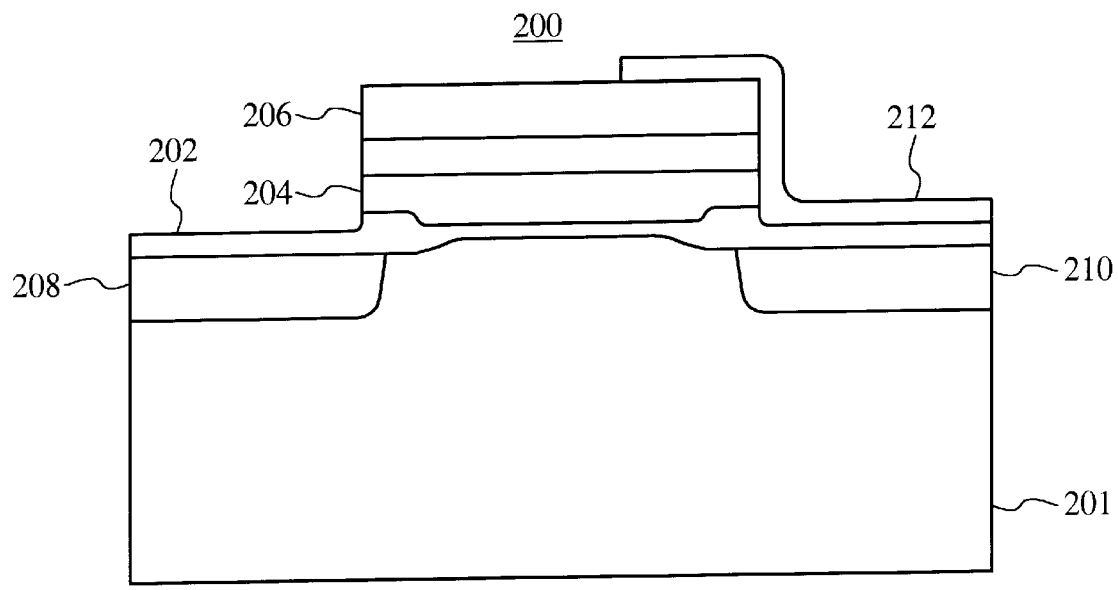
FIG. 5A is a schematic depicting a flash memory cell in accordance with the present invention prior to an anneal in an oxidizing agent.

A reoxidation step is then performed by annealing the source, drain and mask on the semiconductor in an oxidizing agent via step 160. FIG. 5A depicts a memory cell 200 formed on a semiconductor 201 in accordance with the method 150 prior to the reoxidation step 160. The memory cell 200 includes a tunnel oxide 202, and a gate stack including at least a floating gate 204 and a control gate 206. The memory cell 200 also includes a source 208 and a drain 210 implanted in step 154. The nitride mask 212 covers at least the portion of the drain 210 near the floating gate 204. In a preferred embodiment, the nitride mask 212 completely covers the drain 210.

Figure 5B:
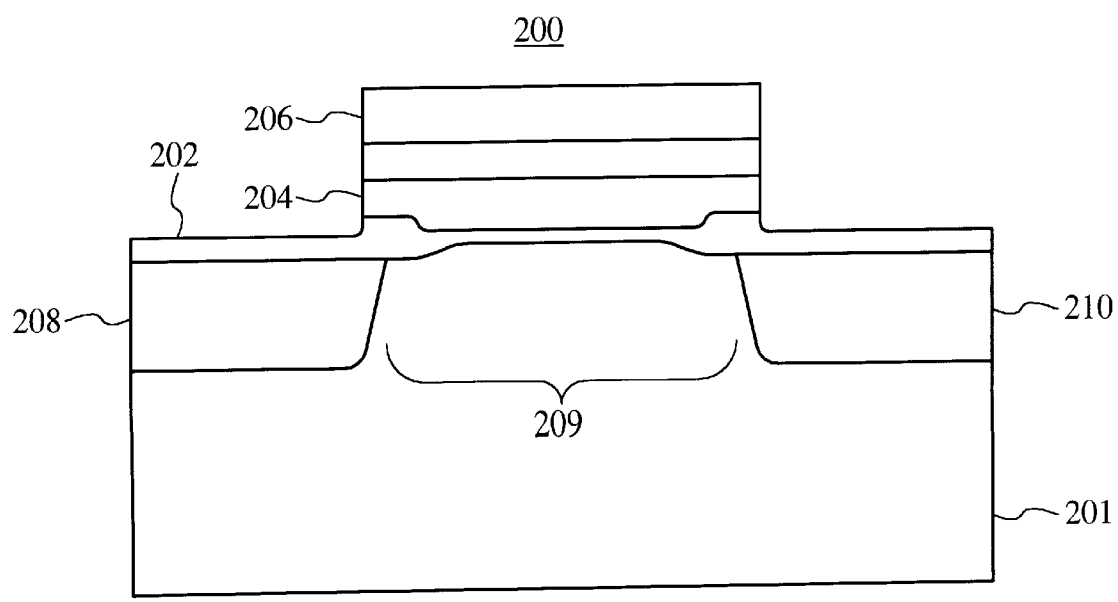
FIG. 5B is a schematic depicting a flash memory cell in accordance with the present invention after an anneal in an oxidizing agent.

FIG. 5B depicts the memory cell 200 in accordance with either the method 100 or the method 150. Because the source 208 has undergone oxidation enhanced diffusion, erase characteristics of the memory cell 200 are improved. For example, the source 208 is driven relatively far under the floating gate 204, allowing for increased tunneling.

In addition, the drain 210 has not undergone oxidation enhanced diffusion either because the drain was implanted after the source was reoxidized in step 106 or because the drain was masked during reoxidation step 160. As a result, the channel 209 is longer than a channel 29 in a conventional memory cell 20 having the same gate length. Consequently, short channel effects are reduced.

Moreover, the memory cell 200 can be made smaller for a given size of the channel 209. Because the drain 210 is not driven as far under the floating gate 204 than in the conventional method 10, the length of the floating gate 204 can be made smaller without decreasing the length of the channel 209 beyond the length of a conventional channel 29. More memory cells 200 can, therefore be packed in a given area. Thus, the density of a flash memory can be increased. In addition, because reoxidation is avoided at the drain 210, the edge of the floating gate 204 near the drain 210 is lifted less, thereby improving drain-side reliability.

A method and system has been disclosed for providing a memory cell. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a memory cell on a semiconductor comprising the sequential steps of:

(a) providing a source implant in the semiconductor;

(b) providing a first anneal of the source implant in an oxidizing agent; and (c) providing a drain implant in the semiconductor after the first anneal;

wherein the drain implant diffuses laterally through the semiconductor less than the source implant.

2. The method of claim 1 further comprising the step of:

(d) providing a second anneal of the source implant and the drain implant.

3. The method of claim 2 wherein the drain implant is exposed to substantially less of the oxidizing agent during the second anneal step (d) than the source implant was exposed to during the first anneal step (b).

* * * * *